(12) United States Patent
Liou et al.

(10) Patent No.: US 7,469,443 B2
(45) Date of Patent: Dec. 30, 2008

(54) BRUSH FOR CLEANING WAFER

(75) Inventors: Huey-Chiang Liou, Fremont, CA (US); Alexander Tregub, San Jose, CA (US); Mansour Moinpour, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 776 days.

(21) Appl. No.: 11/032,858

(22) Filed: Jan. 10, 2005

(65) Prior Publication Data

US 2006/0151003 A1    Jul. 13, 2006

(51) Int. Cl.
*B08B 1/04* (2006.01)

(52) U.S. Cl. .................. 15/230.16; 15/102; 15/230; 15/244.4

(58) Field of Classification Search ............. 15/97.1, 15/102, 244.1, 244.4, 230, 230.16
See application file for complete search history.

(56) References Cited

U.S. PATENT DOCUMENTS

| | | | |
|---|---|---|---|
| 4,566,911 A * | 1/1986 | Tomita et al. ............ | 134/6 |
| 5,725,414 A | 3/1998 | Moinpour et al. | |
| 6,079,073 A * | 6/2000 | Maekawa ................. | 15/77 |
| 6,182,323 B1 | 2/2001 | Bahten | |
| 6,423,149 B1 * | 7/2002 | Crevasse et al. ........... | 134/6 |
| 6,471,993 B1 | 10/2002 | Shastri et al. | |
| 2002/0100132 A1 * | 8/2002 | McMullen et al. ......... | 15/102 |
| 2003/0005537 A1 * | 1/2003 | Mihara et al. ........... | 15/230.16 |
| 2003/0046783 A1 * | 3/2003 | Chen et al. ............... | 15/244.4 |

OTHER PUBLICATIONS

Follonier et al., "Various ways of modulating the release of diltiazem hydrochloride from hot-melt extruded sustained release pellets prepared using polymeric materials," Journal of Controlled Release, vol. 36, Issue 3, Oct. 1995, pp. 243-250.

Hwang et al., "The effects of polymer concentration and a pore-forming agent (PVP) on HEMA-MMA microcapsule structure and permeability," Journal of Membrane Science, vol. 108, Issue 3, Dec. 29, 1995, pp. 257-268.

Kwok et al., "Design of infection-resistant antibiotic-releasing polymers: I. Fabrication and formulation," Journal of Controlled Release, vol. 62, Issue 3, Dec. 6, 1999, pp. 289-299.

Kwok et al., "Design of infection-resitant antibiotic-releasing polymers: II. Controlled release of antibiotics through a plasma-deposited thin film barrier," Journal of Controlled Release, vol. 62, Issue 3, Dec. 6, 1999, pp. 301-311.

(Continued)

*Primary Examiner*—Mark Spisich
(74) *Attorney, Agent, or Firm*—Schwabe, Williamson & Wyatt, P.C.

(57) ABSTRACT

In a formulation of a wafer cleaning brush, forming a polymer solution with a plurality of nano-scale porogens or with a synthetic pore forming agent and curing the polymer solution to form a porous polymeric material.

4 Claims, 4 Drawing Sheets

OTHER PUBLICATIONS

Schmid et al., "Hydrophilic gels of poly(trimethylolpropane trimethacrylate-co-acrylamide)," Reactive Polymers, vol. 15, Nov. 1991, pp. 49-54.

Ward et al., "The effect of microgeometry, implant thickness and polyurethane chemistry on the foreign body response to subcutaneous implants," Biomaterials, vol. 23, Issue 21, Nov. 2002, pp. 4185-4192.

Yue et al., "Preparation of fibrous porous materials by chemical activation: 1. $ZnCl_2$ activation of polymer-coated fibers," Carbon, vol. 40, Issue 8 Jul. 2002, pp. 1181-1191.

Yue et al., "Preparation of fibrous porous materials by chemical activation: 2. $H_3PO_4$ activation of polymer coated fibers," Carbon, vol. 41, Issue 9 2003, pp. 1809-1817.

* cited by examiner

BRUSH FOR CLEANING WAFER

BACKGROUND

1. Technical Field

Embodiments of the present invention are related to the field of cleaning brushes, and in particular, to porous polymeric cleaning brushes for semiconductor wafers.

2. Description of Related Art

Chemical-mechanical polishing ("CMP") is a commonly used technique for planarizing a film on a semiconductor wafer prior to processing of the wafer. CMP often requires an introduction of a polishing slurry onto a surface of the film as the wafer is being mechanically polished against a rotating polishing pad. The polishing slurries typically are water based and can contain fine abrasive particles such as silica, alumina, and other abrasive materials.

Referring to FIG. 1, after polishing is complete (post-CMP), the processed wafer 10 is cleaned by single side or double side scrubber 12 to remove residual slurry and other residue from the polishing process in order that the surface is ready for other processing steps such as etching, photolithography, and others. The wafer 10 is scrubbed on at least one side with at least one roller-shaped cleaning brush 14.

Referring to FIG. 2, a cross-sectional view of one of the cleaning brushes 14 is shown. The cleaning brush 14 is often made of a porous polymeric material which is sponge-like and elastic with a desired amount of abrasion resistiveness. The porous polymeric material may also be referred to as a porous polymer matrix. For example, polyvinyl alcohol (PVA) may be used as a starting substance to form the porous polymer matrix. Typically, a pore forming agent (PFA) is used to create the porous structure of the polymeric material. A mixture of PVA and PFA then is subjected to a reaction with an aldehyde (such as formaldehyde) to convert the PVA to the porous polymer matrix.

In forming a porous polymeric brush, as previously described, PVA and formaldehyde may be used, both of which are synthetic chemical substances with controlled properties. However, the properties of the brush, such as compressive stress, are not stable and have a tendency to vary depending on the time of year. For example, use of natural PFAs, such as starch, is a common technique for introducing porosity into the polymer matrix. However, this technique may change key properties of the brush, such as pore size and pore size distribution, which unpredictably depend on the time of year, location of the crop and the like. These changes in pore size and pore size distribution may affect the brush's physical and mechanical properties. Variations in pore shape and distribution affect the flow of a cleaning liquid, such as deionized water (DIW), and other chemical solutions used for post-CMP cleaning. Additionally, different vendors may use different PFAs, adding to the unpredictable properties.

Due to change of PFA, the compressive stress of the brush on the wafer may change by as much as 25%. There is a correlation between the change of PFA and compressive stress. Compressive stress of the brush may be a significant parameter that determines the pressure applied to the wafer in post-CMP cleaning process. A change in the brush's compressive stress may require adjustment in the pressure on the wafer by the scrubber and may cause either wafer defects (excessive pressure) or incomplete cleaning (reduced pressure). In other words, these variations may necessitate the adjustment of the brush's composition to match physical and mechanical properties of the brush produced using PFA with different properties.

Consequently, variations in key physical and mechanical properties of the brush may change in an uncontrolled and an unpredictable manner. Current CMP processes may not be sensitive to the subtle changes in the brush physical and mechanical properties caused by these variations in the properties of the PFA. Moreover, as the dimensions of IC's decrease, the variations in the brush properties may play an even more significant role.

Referring to FIGS. 2 and 3, in one implementation, the brush 14 has a multiplicity of protrusions or nodules 24 disposed on its surface, with the nodules 24 containing a multiplicity of macropores and micropores (not shown). Serious defects in advanced integrated circuit (IC) devices and processes are becoming smaller to the nanometer scale. Nodules 24 having larger pore sizes in the macro-pore size or micro-pore size range, as illustrated by a micro-pore 26 in FIG. 3, often have some "dead spots" with respect to highly dense IC devices of substrate 28. Hence, such nodules 24 may not be able to clean the defects/particles 30 sized on the nanometer scale. Instead, the nodules 24 may only be effective in removing macro-size or micro-size defects/particles 32 from the substrate 28. In other words, the cleaning brushes 14, with macro/micro-scale pores, may not be able to have effectively physical contact to remove/clean the nano-scale defects/particles 30. The particles/defects 30 and 32 may particularly accumulate in recesses between layers and patterns 34 of the substrate 28.

DETAILED DESCRIPTION OF ILLUSTRATIVE EMBODIMENTS

Figure 1:
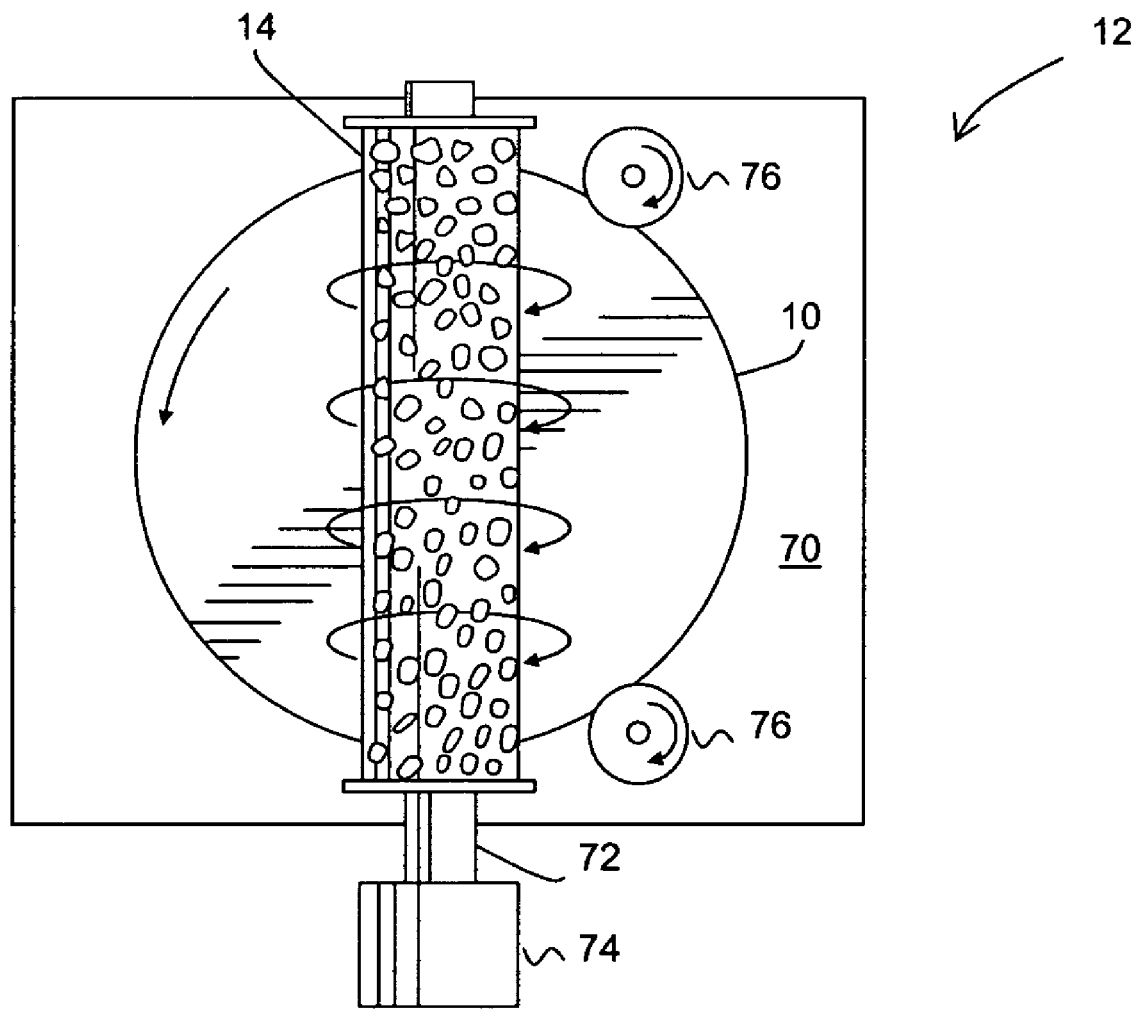
FIG. 1 shows a top view of a prior art wafer scrubber which includes one or more cleaning brushes.
Figure 2:
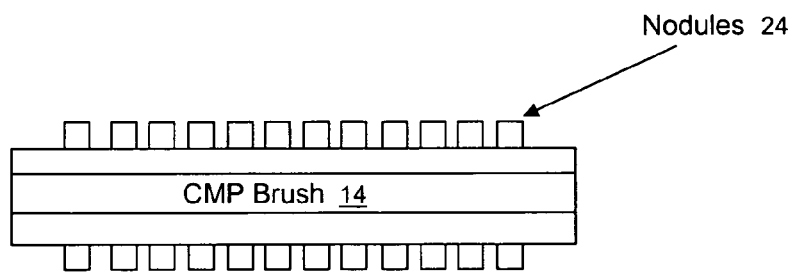
FIG. 2 shows a cross-sectional view of the prior art cleaning brush shown in FIG. 1.
Figure 3:
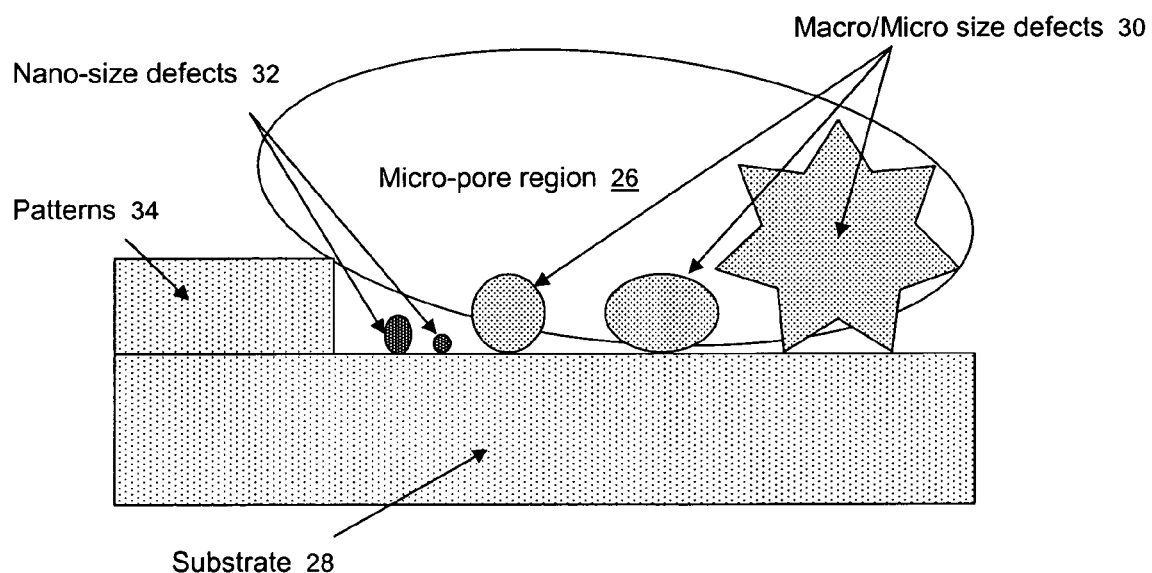
FIG. 3 is a diagram illustrating an IC substrate, having various sized particles, which is cleaned in a prior art process with the scrubber of FIG. 1.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

In general, manufacturing stages of a post-CMP cleaning brush, which are related to introducing pores into the brush body and closing micropores on the tips of the brush nodules, according to various methods of the present invention, may be divided into two manufacturing stages. In a first stage, pore forming agents and processes are implemented to make pore distribution and sizes more controllable and more uniform in the cleaning brush. In a second stage, the pores are made smaller or partially closed on tips of a plurality of nodules of the cleaning brush to allow for more complete removal of the small particles. The cleaning brush may be used in scrubbers for the semiconductor industry, such as the scrubber 12 illustrated in FIG. 1, for cleaning semiconductor wafers or substrates after the chemical-mechanical polishing (CMP) process. In one scrubber application, the cleaning brush may be used after completion of the first stage of manufacturing. In another scrubber application, the cleaning brush may be used after completion of both stages of manufacturing.

With respect to the previously-mentioned first stage of manufacturing, the post-CMP cleaning brush, according to two methods of the present invention, may be formed with a chemical composition providing stability in the brush's physical and mechanical properties and stability in the CMP process. In other words, the cleaning brush may be formed with more stable, controllable and predictable properties. An overview of two methods for forming the post-CMP cleaning brush with the desired chemical composition will now be provided. In the first method, the composition of the brush may be formulated by a mixture of a polymer (such as PVA), a synthetic chemical pore forming agent (PFA) having controlled properties, and an aldehyde (such as formaldehyde), followed by a subsequent cure. The synthetic PFA is a replacement for the traditional natural PFA with uncontrolled properties of the prior art. Examples of such synthetic PFAs include bovine serum albumin (BSA), poly(ethylene glycol) (PEG), poly(vinyl pyrrolidone) (PVP), or ethyl acetate. In the second method, the brush may be formulated using a porous polymer matrix, such as a porous PVA matrix, wherein porosity is created in the controlled manner using a reaction with zinc chloride ($ZnCl_2$), as described in detail hereinafter.

In both the first and second methods, the starting polymer (such as PVA) may be processed to form a porous polymeric material (also referred to as a porous polymer matrix), which is used for the brush. In other words, the brush is a semi-solid object made of a polymer, which contains a continuous or discontinuous porous network. In general, the porous polymeric material may vary in characteristics depending upon the type of synthetic pore forming agent or process, the type of aldehyde employed, and other factors. These factors also may include the relative proportions of reactants, reaction temperature and time, and the general condition and starting materials in the manufacturing process. Use of different synthetic additives and/or different chemical reaction to form pores may produce different pore shapes and sizes.

With respect to the first method using synthetic PFAs, several specific examples of formulation of polymer matrices with the embedded synthetic pore forming agents now are described in more detail. In a first example, bovine serum albumin (BSA) may be completely dissolved in ultra-filtered water in a ratio of 1/30. This solution then may be added to a mixture of PVA and formaldehyde with subsequent cure at elevated temperatures. For example, one possible BSA that may be used is identified by Catalog #810033, ICN Biomedicals Inc., Costa Mesa, Calif.

In a second example, poly(ethylene glycol) (PEG) may be completely dissolved in ultra-filtered water in a ratio of 1/100. This solution then may be added to a mixture of PVA and formaldehyde with subsequent cure at elevated temperatures. For example, one possible PEG that may be used is identified by PEG molecular weight (Mw) 4,000; Catalog #6102, Polysciences, Warrington, Pa.

In a third example, up to 4 weight percent (wp) of poly(vinyl pyrrolidone) (PVP) may be added to PVA, which then is mixed with formaldehyde and cure at elevated temperatures. Adding PVP to the polymer solution may increase permeability by as much as 25-fold. This may increase external pore density (defined as the number of pores per unit surface area) without significant deviation in pore size and its distribution. For example, one possible PEG that may be used is identified by PVP K120, GAF® ISP Technologies, Mw=2900000.

In a fourth example, ethyl acetate may be added to the mixture of PVA and formaldehyde with subsequent cure at the elevated temperatures. Ethyl acetate may form different types of the pore sizes and distributions in polymer matrices, depending on the type and amount of the polymer. For example, in acrylamide, the pore size distribution of small pores ($d \leq 100$ Å) shows a decrease in the number of pores when the amount of acrylamide increased, while pore volume of large pores ($d \geq 100$ Å) increases as the amount of acrylamide decreases.

With respect to the second method, a specific polymer reaction to prepare a porous polymer matrix, such as a PVA polymer matrix, is described. For a PVA polymer matrix, examples of the starting PVA polymer may be one of four kinds of polyvinyl alcohol from Aldrich, with different average molecular weights Mw (no. 1: 98-99% hydrolyzed, avg. Mw 31000-50000; no. 2: 99+ % hydrolyzed, avg. Mw 50000; no. 3: 99+ % hydrolyzed, avg. Mw 89000-98000; no. 4: 99+ % hydrolyzed, avg. Mw 124000-186000)). The starting PVA polymer may be mixed with phosphoric acid (86%), where the acid serves as an activation agent, and zinc chloride ($ZnCl_2$), followed by stabilization in air and by a heat treatment in nitrogen ($N_2$). More specifically, in one embodiment, the PVA powder (e.g., 1.2 g) may be added into a flask with 17 ml of water. The powder may be dispersed into the water with electromagnetic stirring and then dissolved by heating to 90° C. After cooling, 1.2 ml of $H_3PO_4$ may be added to give a homogeneous solution. The $ZnCl_2$ then may be removed by washing with deionized water (DIW) water and hydrochloric acid (HCL). $ZnCl_2$ may act as a dehydration agent to promote the thermal cross-linking of polymer at a lower temperature, leading to polymers having much higher char yields and very high surface areas. The porosity is created by dissolution of the $ZnCl_2$ left in the charred coating. The porosity may be controlled by the activation temperature and concentration of $ZnCl_2$.

In summary, the above two methods of achieving the desired chemical composition of the cleaning brush address the following two issues. First, the methods address the difficulty involved in preventing change of the key physical and mechanical properties, such as compressive stress, of the brush. This change may be related to unpredictable properties of the new crop used to prepare pore forming agent (PFA). Second, the methods address the difficulty involved in adjustment of the brush composition to match physical and mechanical properties of the brush produced using PFA with different properties, such as particle size distribution. The first method addresses these difficulties by using one of four pore forming agents described above, a polymer, and formaldehyde, with subsequent cure to form a porous polymeric material. The second method forms a porous polymer matrix wherein porosity is created in the controlled manner using reaction with $ZnCl_2$.

Figure 4:
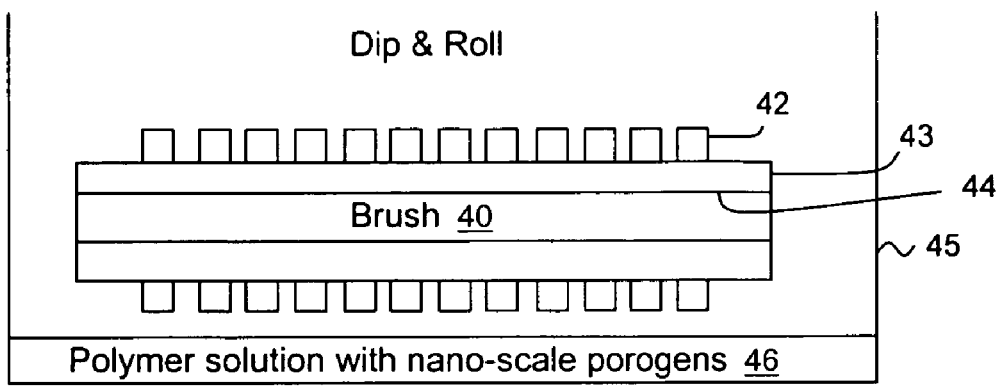
FIG. 4 illustrates one stage of a coating process, according to one method of the present invention, for coating a cleaning brush, according to one embodiment of the present invention.

Referring to FIG. 4, there is illustrated a cleaning brush 40, according to another method and embodiment of the present invention, which includes nano-size pores in addition to macro/micro-size pores. This method may start with a cleaning brush formed according to the first stage of manufacturing described above. Thereafter, in the previously-mentioned second stage of manufacturing, the cleaning brush 40 is formed. The cleaning brush 40 may be used in scrubbers for the semiconductor industry, such as the scrubber 12 illustrated in FIG. 1, for cleaning semiconductor wafers or substrates after the chemical-mechanical polishing (CMP) process. The cleaning brush 40 not only has surface cleaning capability for macro/micro-scale geometries, but also has enhanced cleaning capability in the form of cleaning for nano-scale geometries.

The cleaning brush 40 has a plurality of nodules 42. In one embodiment, the nodules 42 may have a tubular configuration. Although the nodules 42 are illustrated with a circular cross-section, the nodules 42 may assume a variety of shapes, e.g., circular, ellipsoidal, rectangular, diamond, or the like. The nodules 42 may be fairly uniformly distributed in spaced-apart, protruding relationship over its cylindrical-shaped core 43. The core 43 may have an interior bore or cylindrical aperture 44 to receive a shaft (not shown). The nodules 42 provide the areas which have physical contact with a substrate or wafer. The substrate 10 of FIG. 1, which may be a silicon substrate, illustrates one such substrate.

In FIG. 4 the cleaning brush 40 is shown positioned over a container 45. In one embodiment, the container 45 may have a polymer solution 46 with nano-scale porogens. A "porogen", as used herein, means a non-gaseous material that is soluble in at least one solvent and non-soluble or sparingly soluble in at least one other solvent, that is combined with a material to form a mixture, then removed from the mixture to leave voids. More specifically, in one embodiment, the porogens, which may be solid particles, may be insoluble or sparingly soluble in the polymer solution 46 at a temperature at which the particles are blended with the polymer solution. The polymer solution and the porogens may be combined to form a slurry. In one embodiment, the slurry then may be treated with a porogen solvent in which the porogen is soluble, and in which the polymer is insoluble or sparingly soluble. The polymer precipitates in this porogen solvent; at the same time, the porogens are extracted from the mixture. In another embodiment, the porogens may be thermally removable solid particles. Forming the polymeric material may occur without substantially removing the particles, followed by heating of the polymeric material to substantially remove the particles and thereby leaving voids or free spaces to form the porous polymeric material (also referred to as a porous polymer matrix). Illustrative porogens that may be used include powdered sugar and starch.

Figure 5:
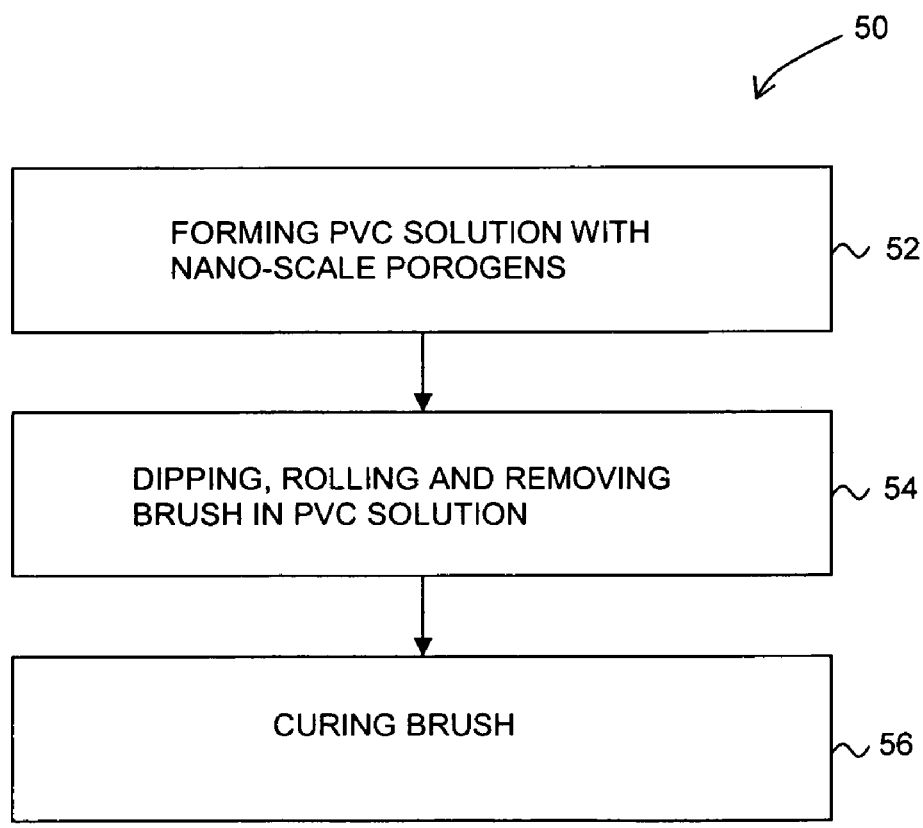
FIG. 5 is a flow chart of the coating process according to one method of the present invention.

Referring to FIG. 4 and a flow chart 50 of FIG. 5, there is shown a coating process, according to one method of the present invention, to provide the nodules 42 of the cleaning brush 40 with both micro-scale and nano-scale pores. At a stage 52 of FIG. 5, the polymer solution 46 with nano-scale porogens may be formed in the container 45 and the cleaning brush 40 may be positioned over the container 45. At a stage 54 of FIG. 5, the cleaning brush 40 is dipped into and rolled in the polymer solution 46 and thereafter removed from the polymer solution 46. In this manner, the extremity areas of the nodules 42 on the cleaning brush 40 are coated with a thin layer of the nano-porous polymer solution 46. At a stage 56, the cleaning brush 40 may go through another curing process to create the nano-size porous region in the nodules 42. The nodules 42 are described in detail below with respect to FIG. 6. During this curing stage, the porogens are removed from the polymer material using one of the two previously described approaches to form the porous polymeric material.

Figure 6:
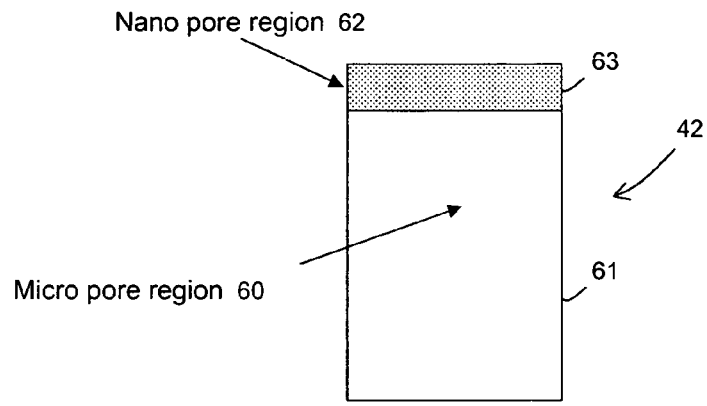
FIG. 6 illustrates one of a plurality of nodules of the cleaning brush according to one embodiment of the present invention.

Referring to FIG. 6, as a result of the above-described coating process, each of the nodules 42 of the cleaning brush 40 may have been defined to have two integral portions: (1) a macro/micro-pore region portion 60 having a plurality of macro/micro-pores formed in an original polymer protrusion 61 and (2) a nano-pore region portion 62 having a plurality of nano-pores formed in a polymer layer 63. The polymer layer 63 coats the extremity of the polymer protrusion 61 to form the nano-pore region portion 62 of the nodule 24. The portion of the polymer protrusion 61 not coated by the polymer layer 63 forms the macro/micro-pore region portion 60 of the nodule 42. The coating thickness of the polymer layer 63 forming the nano-pore region portion 62 may be a few micrometers to few millimeters thick. The macro/micro-pore region portion 60 may have macro/micro-pore sizes greater than 1 um diameter and the added nano-pore region portion 62 may have nano-pore sizes less than 1 um diameter. Hence, each of the nodules 42 include the macro/micro-pore region portion 60 adjacent to the core 43 of the brush 40 and the nano-pore region portion 62 remotely disposed to the core 43 at the outer extremity of the nodule 42. In other words, the macro/micro-pore region portion 60 is proximately located relative to the core 43 and the nano-pore region portion 62 is distally located relative to the core 43.

Figure 7:
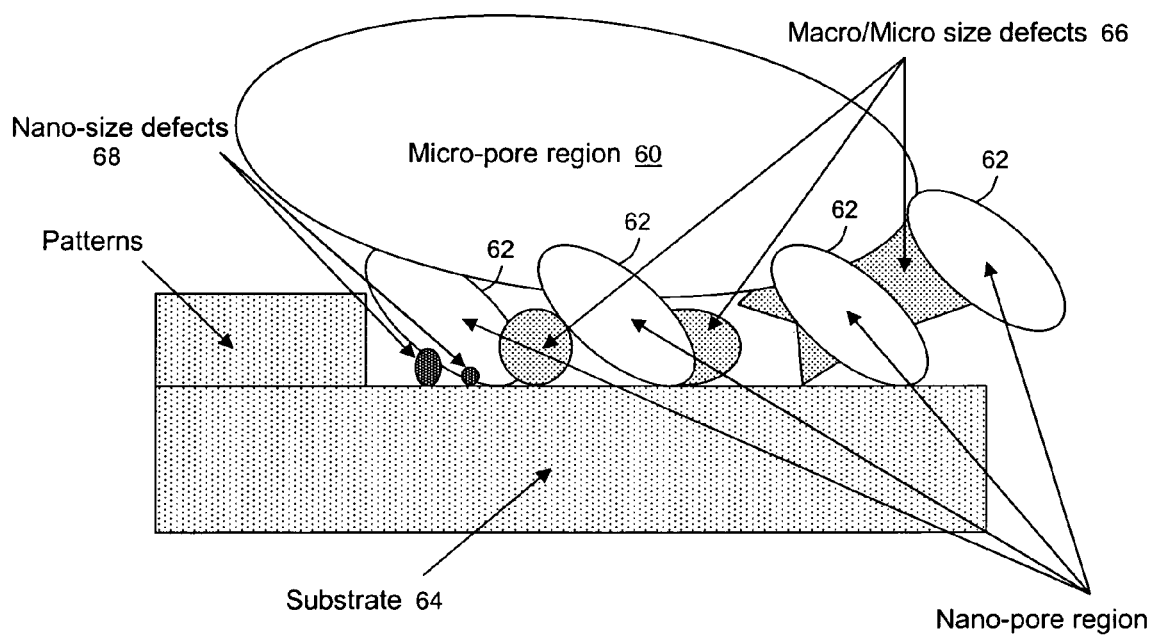
FIG. 7 is a diagram illustrating an IC substrate, having various sized particles, which is cleaned in a cleaning process using the scrubber of FIG. 1 with at least one cleaning brush according to one embodiment of the present invention.

Referring to FIG. 7, a cleaning action of the cleaning brush 40, with nodules 42 having both the macro/micro-pores region portion 60 and the nano-pore region portion 62, is conceptually illustrated for cleaning a substrate 64 having macro/micro-size defects or particles 66 and nano-size defects or particles 68. In comparison to the prior art, the nano-pore region portions 62 in the cleaning brush 40 may have more effectively physical contact (less dead spots) with the dirty surface of the substrate 64 so as to more effectively remove the nano-scale defects/particles 68 on the dirty surface. Likewise, the macro/micro-pore region portions 60 of the cleaning brush 40 may effectively remove the macro/micro-size defects/particles 66. In summary, in comparison to FIG. 1, there may be less "dead spots" in macro/micro/nano-scale geometries using the cleaning brush 40 with macro/micro/nano-pores when used in cleaning wafers or substrates of advanced IC devices.

The macro/micro-pore region 60 (and therefore the polymer protrusion 61 and the core 43) may be described as being formulated using a first polymer solution having a porous forming agent (PFA), which is processed as described above to form a first polymeric material. The nano-pore region portion 62 may be described as being formulated using a second polymer solution having the porogens, which is processed to form a second polymeric material. The first polymer material may be formed using the process described with respect to the prior art or it may be formed using other embodiments according to the present invention for the formulation of the porous polymeric materials of the cleaning brushes described hereinafter. In one embodiment, both the first and the second polymer solutions may both start with a PVA solution. In the formulation of the first polymer solution, the PFA may be mixed with the dissolved PVA and in the formulation of the second polymer solution, the porogens may be mixed with the dissolved PVA.

Use of the scrubber 12 was in part previously described with respect to the prior art FIG. 1. The scrubber 12, utilizing one or two brushes 14 in accordance with the one of the embodiments of the present invention, operates in the same manner as in the prior art but with the desired enhanced results described above that are derived from use of the brush 14. More specifically, referring back to FIG. 1, the operation of the scrubber 12 now is described in more detail. During the CMP process, a polishing slurry may be introduced by a liquid dispensing arm (not shown) onto a surface of the wafer 10 while the wafer 10 is being mechanically polished against a rotating polishing pad (not shown). The polishing slurries may be water based and may contain fine abrasive particles such as silica, alumina, and other abrasive materials. After polishing is complete (post-CMP), the processed wafer 10 may be cleaned by single side or double side scrubber 12 to remove residual slurry and other residue from the polishing process in order that the surface is ready for other processing steps such as etching, photolithography, and others. In a double sided scrubber, the wafer 10 may be scrubbed simultaneously on both sides by roller-shaped cleaning brushes 14, with a first brush 14 being shown and a second brush (not shown) being beneath wafer 10 and directly below the first brush 14. In a single side scrubber, one side of the wafer 10 may be scrubbed at a time with one brush 14. The wafer 10 may sit upon a conveyor mechanism 70 that moves the wafer 10 into the brush or brushes 14. The brush or brushes 14 may be mounted on a shaft 72 which is rotated about its central axis by a motor 74. Rollers 76 may assist in holding the wafer 10 in place and rotating the wafer 10 so the entire surface of the wafer 10 is cleaned. A combination of rotational movement of the brush or brushes 14 and force or pressure placed on the brush 14 against the wafer 10 causes the residual slurry materials to be removed from the surface of the wafer 10.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A wafer cleaning brush, comprising:
   a core; and
   a plurality of spaced-apart nodules disposed to protrude from the core, each of the nodules having a first portion proximately located relative to the core, the first portion including a plurality of micro-size pores, and a second portion distally located relative to the core, the second portion including a plurality of nano-size pores, and each of the nodules including a protrusion of a first porous polymeric material having the plurality of micro-size pores and a layer of a second porous polymeric material having the plurality of nano-size pores coated over a part of the protrusion to form the second portion, with the first portion being an exposed part of the protrusion not coated by the layer.

2. The wafer cleaning brush according to claim 1, wherein the first porous polymeric material is formed from a first mixture of a polyvinyl alcohol and a porous forming agent; and the second porous polymeric material is formed from a second mixture of the polyvinyl alcohol and a plurality of porogens.

3. The wafer cleaning brush according to claim 1, wherein the nano-size pores have a diameter of less than 1 um.

4. The wafer cleaning brush according to claim 3, wherein the micro-size pores have a diameter greater than 1 um.

* * * * *